US007796968B2

(12) United States Patent
Hwang et al.

(10) Patent No.: US 7,796,968 B2
(45) Date of Patent: Sep. 14, 2010

(54) FREQUENCY CONVERSION CIRCUIT

(75) Inventors: Hyeon Seok Hwang, Seoul (KR); Seung Min Oh, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 657 days.

(21) Appl. No.: 11/878,145

(22) Filed: Jul. 20, 2007

(65) Prior Publication Data
US 2008/0051055 A1    Feb. 28, 2008

(30) Foreign Application Priority Data
Jul. 20, 2006    (KR) .................... 10-2006-0067852

(51) Int. Cl.
*H04B 1/26*    (2006.01)
(52) U.S. Cl. .................. 455/326; 455/310; 455/323
(58) Field of Classification Search ................. 455/296, 455/298, 305, 323, 324, 280, 283, 290, 293, 455/326
See application file for complete search history.

(56) References Cited
U.S. PATENT DOCUMENTS

| 5,918,167 | A  | * | 6/1999 | Tiller et al. ................ 455/310 |
| 6,850,753 | B2 | * | 2/2005 | Zhang et al. ............... 455/341 |
| 7,161,406 | B1 | * | 1/2007 | Ferris ........................ 327/359 |
| 2004/0043742 | A1 | * | 3/2004 | Beumer ..................... 455/323 |
| 2005/0101280 | A1 |   | 5/2005 | Behzad |
| 2005/0168275 | A1 |   | 8/2005 | Torres et al. |
| 2007/0142018 | A1 | * | 6/2007 | Lin et al. ................... 455/326 |
| 2008/0305759 | A1 | * | 12/2008 | Tervaluoto et al. ......... 455/326 |
| 2009/0045876 | A1 | * | 2/2009 | Wang et al. ................ 330/258 |
| 2010/0105350 | A1 | * | 4/2010 | Baltus ....................... 455/326 |

* cited by examiner

*Primary Examiner*—Edward Urban
*Assistant Examiner*—Christian A Hannon

(57)    ABSTRACT

A frequency conversion circuit comprises an input stage composed of one or more transistors, the input stage outputting a current corresponding to a voltage-type RF signal which is input to the gate of the transistor; a frequency conversion stage receiving an LO signal, causing the output RF signal to transit by the frequency of the LO signal so as to output an IF signal, and detecting an output voltage of the IF signal; a bleeding transistor connected to the input stage, supplying a current corresponding to a DC voltage, applied to a gate-source stage thereof, as a bleeding current to the transistor of the input stage, and in an AC manner, operating complementarily with the input stage to control a current flowing in the frequency conversion stage; a common mode feedback circuit comparing an output voltage provided from the frequency conversion stage with a preset reference voltage, adjusting the output voltage such that the output voltage is equalized to the reference voltage, and directly feeding the adjusted output voltage to the bleeding transistor; and a load stage composed of resistors and distributing a power supply voltage to apply to the frequency conversion stage.

7 Claims, 5 Drawing Sheets

[FIG. 1A]
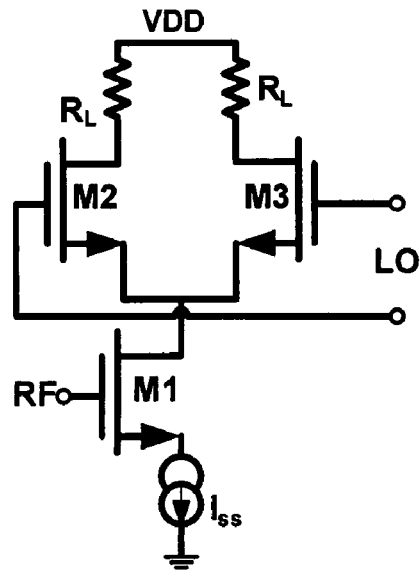
[FIG. 1B]
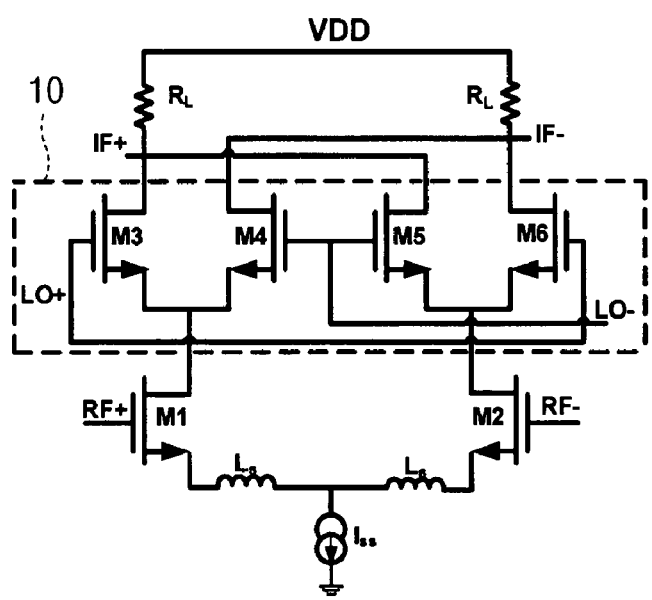

[FIG. 2]
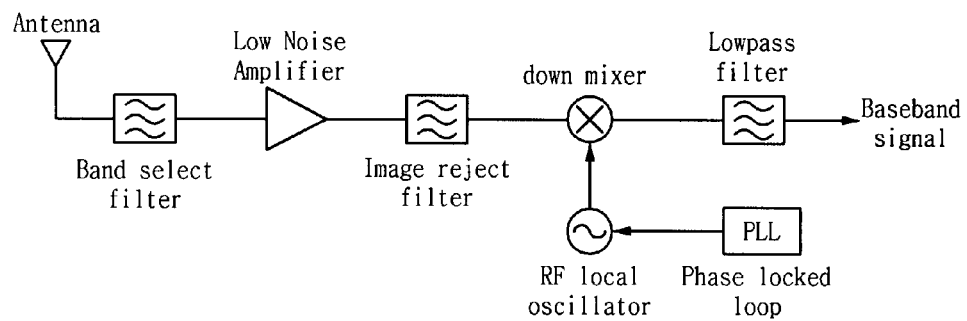
[FIG. 3]
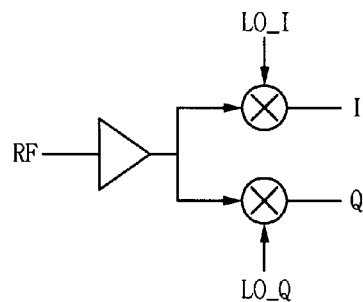

[FIG. 4A]
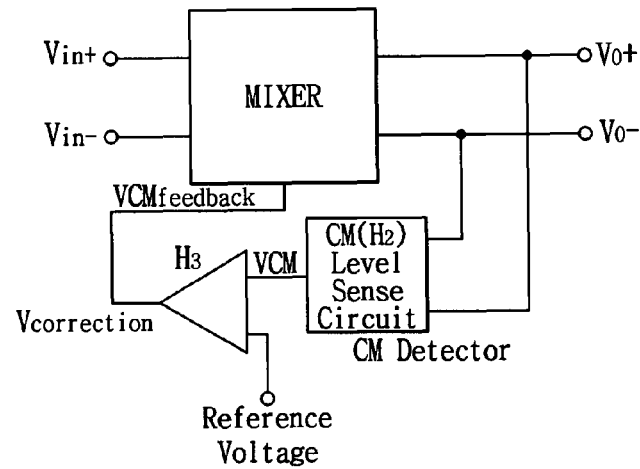
[FIG. 4B]
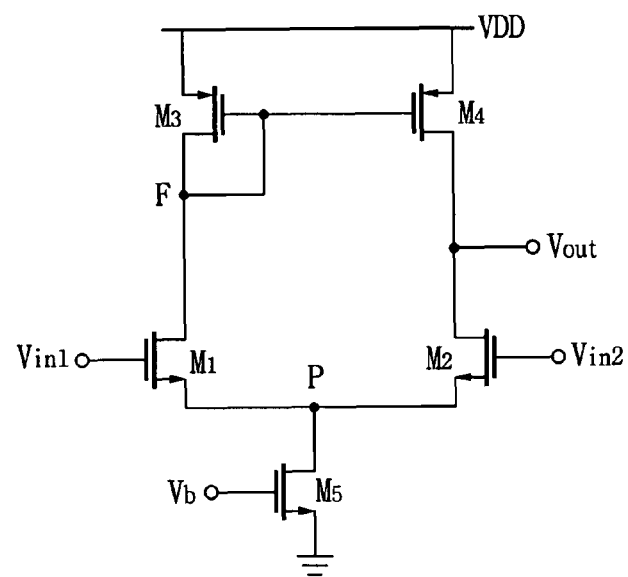
[FIG. 4C]
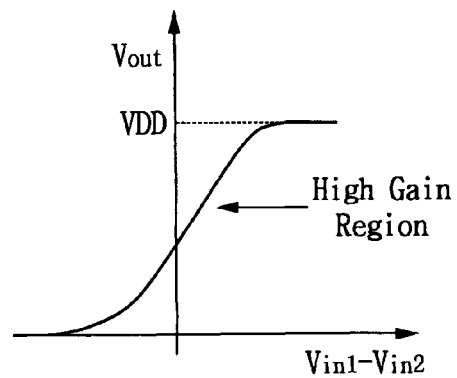

[FIG. 5]
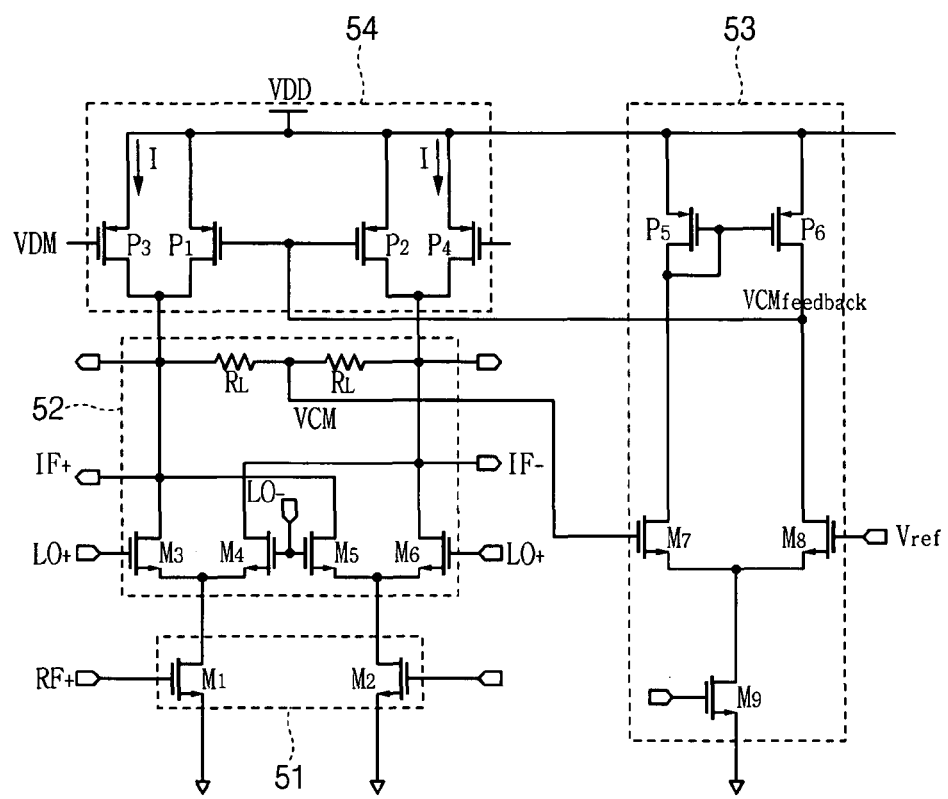

[FIG. 6]
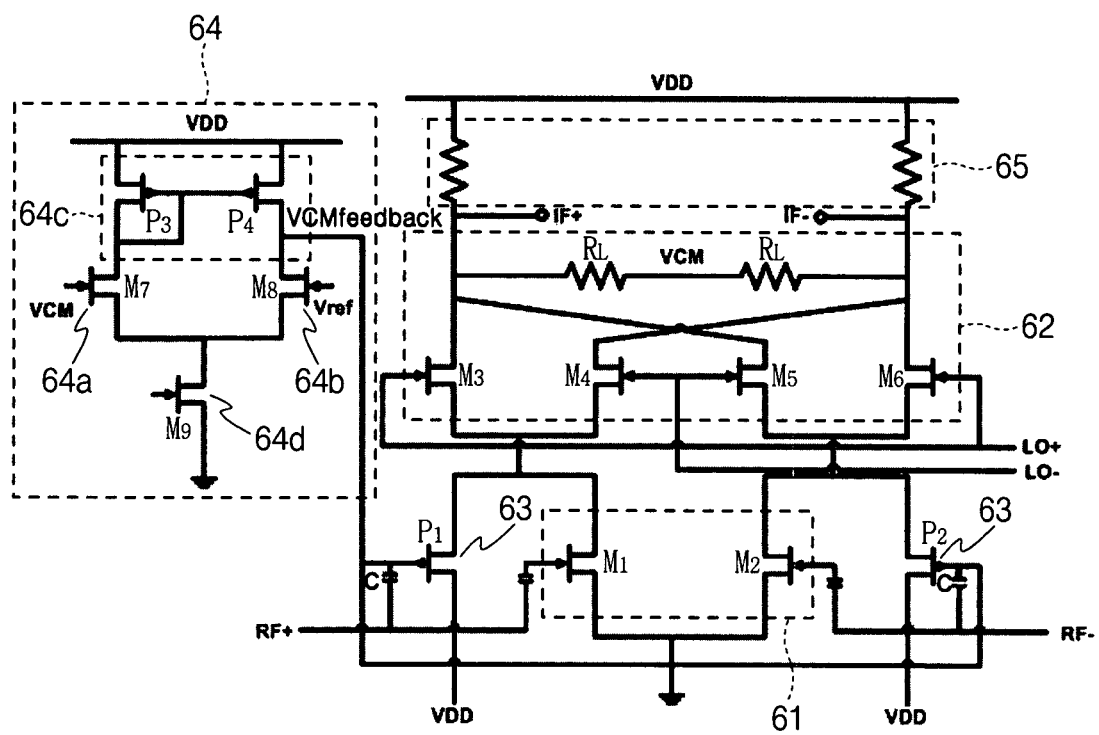

FREQUENCY CONVERSION CIRCUIT

CROSS-REFERENCE TO RELATED APPLICATIONS

This application claims the benefit of Korean Patent Application No. 10-2006-0067852 filed with the Korea Intellectual Property Office on Jul. 20, 2006, the disclosure of which is incorporated herein by reference.

BACKGROUND OF THE INVENTION

1. Field of the Invention

The present invention relates to a frequency conversion circuit which can obtain a constant output voltage regardless of a change in temperature or process, can enhance a linearity and conversion gain, and can secure a low-noise characteristic.

2. Description of the Related Art

Frequency conversion circuits serve to cause information with an arbitrary frequency to transit into another frequency band and are widely utilized in various communication equipments, for example, a transmitting/receiving system for communication and the like.

The frequency conversion circuit can be divided into an active frequency conversion circuit and a passive frequency conversion circuit, depending on a topology. Between them, the active frequency conversion circuit has a gain and is subdivided into a single-balanced frequency conversion circuit and a double-balanced frequency conversion circuit, depending on an implementing method.

FIG. 1A is a circuit diagram of the single-balanced frequency conversion circuit, and FIG. 1B is a circuit diagram of the double-balanced frequency conversion circuit.

As shown in FIG. 1A, the single-balanced frequency conversion circuit includes an input transistor M1 and two switching transistors M2 and M3.

A gate electrode of the input transistor M1, serving as a control input electrode, receives a predetermined frequency of RF (Radio Frequency) signal. In this case, the RF signal applied to the gate electrode of the input transistor M1 is a substantial signal source. The single-balanced frequency conversion circuit causes the signal source to transit to another frequency band (for example, an intermediate frequency signal (hereinafter, referred to 'IF signal')).

The drain of the input transistor M1 is connected in parallel to the sources of the switching transistors M2 and M3, and the gates of the switching transistors M2 and M3 receive a sine-wave signal (hereinafter, referred to 'LO signal') of a local oscillator. In this case, when any one of the switching transistors M2 and M3 receives an LO signal LO+, the other receives an LO signal LO−. Therefore, the switching transistors M2 and M3 are configured to be reversely driven.

The input transistor M1 provides a current corresponding to a voltage of the RF signal applied to the gate thereof, but the switching transistors M2 and M3 are turned on/off by the LO signal. Therefore, an IF signal which has transited by the frequency of the LO signal is provided to output stages IF+ and IF−. At this time, as the IF signal is differentially selected, the RF signal can be eliminated, but the LO signal is not eliminated.

The double-balanced frequency conversion circuit has been implemented to solve such problems. As shown in FIG. 1B, the double-balanced frequency conversion circuit includes one constant current source $I_{SS}$ connected to two input transistors M1 and M2 forming one differential pair.

The gates of the input transistors M1 and M2 receive predetermined frequencies of RF signals RF+ and RF−, and the input transistors M1 and M2 are connected to a switching circuit 10.

As shown in FIG. 1B, the switching circuit 10 includes a plurality of switching transistors M3 to M6. The transistors M3 and M4 form a pair, and the transistors M5 and M6 form a pair. The gates of the transistors M3 and M6 receive an LO signal LO+, and the gates of the transistors M4 and M5 receive an LO signal LO−.

The sources of the transistors M3 and M4 are connected to the drain of the input transistor M1, and the sources of the transistors M5 and M6 are connected to the drain of the input transistor M2. The drains of the switching transistors M3 and M6 are connected to a power supply VDD through resistors $R_L$, and the drains of the switching transistors M4 and M5 are connected to the drains of the switching transistors M6 and M3 forming another pair, respectively.

The double-balanced frequency conversion circuit configured in such a manner is driven in accordance with the same operation principle as the single-balanced frequency conversion circuit of FIG. 1A. However, currents provided to the output stages IF+ and IF−, respectively, have a phase difference of 180 degrees. Therefore, as the currents are added up, the frequencies of the LO signals LO+ and LO− and the RF signals RF+ and RF− at the output stages IF+ and IF− are offset and eliminated.

The above-described operation of the frequency conversion circuit is based on the triangulation of Equation 1, and the RF signal and the LO signal applied to the frequency conversion circuit and the IF signal output from the frequency conversion circuit can be expressed by Equations 2 to 4.

$$(A\cos\omega_1 t)(B\cos\omega_2 t) = \frac{AB}{2}[\cos(\omega_1 + \omega_2)t + \cos(\omega_1 - \omega_2)t] \quad \text{[Equation 1]}$$

$$RF(t) = V_{RF}\cos(\omega_{RF} t) \quad \text{[Equation 2]}$$

$$LO(t) = \frac{1}{2} + \frac{2}{\pi}\left[\sin(\omega_{LO} t) + \frac{1}{3}\sin(3\omega_{LO} t) + \ldots\right] - \quad \text{[Equation 3]}$$
$$\frac{1}{2} + \frac{2}{\pi}\left[\sin(\omega_{LO} t) + \frac{1}{3}\sin(3\omega_{LO} t) + \ldots\right]$$

$$IF(t) = AV_{RF}\cos(\omega_{RF} t) \quad \text{[Equation 4]}$$
$$\frac{4}{\pi}\left[\sin(\omega_{LO} t) + \frac{1}{3}\sin(3\omega_{LO} t) + \frac{1}{5}\sin(5\omega_{LO} t) + \ldots\right] =$$
$$\frac{2AV_{RF}}{\pi}[\sin(\omega_{RF} + \omega_{LO})t - \sin(\omega_{RF} - \omega_{LO})t]$$

Here, A represents a gain of the frequency conversion circuit, $V_{RF}$ represents the magnitude of an RF signal, $\omega_{RF}$ represents the frequency of an RF signal, and $\omega_{LO}$ represents the frequency of an LO signal.

However, when the frequency conversion circuit is actually implemented, a sine wave is used in an LO signal, instead of a square wave. This is because, when a square wave is used, noise occurs due to a rapid switching operation. Therefore, a sine wave having a similar shape is used at a high frequency.

FIG. 2 is a diagram showing the structure of a receiver using a direct conversion receiver (DCR) scheme. FIG. 3 is a diagram simply showing a portion related to a frequency conversion circuit in the structure of FIG. 2.

As shown in FIG. 3, an Intermediate Frequency signal is omitted in such a DCR scheme compared to heterodyne receiver. Therefore, the structure of the receiver is simplified, as shown in FIG. 2. Accordingly, system-on-chip can be realized, and a cost is reduced. However, a signal loss can be caused by oscillation or the like, and a burden of the frequency conversion circuit becomes so large that a DC offset can occur.

That is, a signal of which the frequency is converted by the frequency conversion circuit (down mixer) shown in FIG. 2 has a center frequency of 0 Hz. At this time, a DC offset is at the center of the signal, causing the signal to be distorted.

Further, since the magnitude of the DC offset is much larger than that of a desired signal, the DC offset may saturate the structure positioned next to the frequency conversion circuit, that is, a structure for processing a baseband signal. Accordingly, the baseband signal is significantly influenced.

To eliminate the DC offset which causes such a problem, a frequency conversion circuit using a common mode feedback circuit has been used in the related art. This is because, since most outputs of a frequency conversion circuit used in the DCR scheme are low-frequency signals, a coupling capacitor blocking a DC component from an RF signal cannot be used. Therefore, the common mode feedback circuit for feeding back a DC voltage has been used in the related art.

FIGS. 4A to 4B show a general common mode feedback circuit. FIG. 4A is a diagram showing a conceptual structure of a general common mode feedback circuit, FIG. 4B is a circuit diagram of the common mode feed back circuit, and FIG. 4C is a diagram showing an output waveform of the common mode feedback circuit.

As shown in FIG. 4A, the basic concept of the general common mode feedback circuit is where a voltage VCM of a signal which is output with a converted frequency is detected and is then compared with a preset reference voltage, the output voltage VCM is adjusted to be equalized to the reference voltage, and the adjusted voltage is fed back.

As shown in FIG. 4C, it can be found that the waveform of a voltage output from the common mode feedback circuit is maintained constantly regardless of a change in temperature or process.

FIG. 5 is a circuit diagram of a conventional frequency conversion circuit. As shown in FIG. 5, the conventional frequency conversion circuit includes an input stage 51, a frequency conversion stage 52, a common mode feedback circuit 53, and a load stage 54.

The input stage 51 composed of transistors M1 and M2 outputs currents corresponding to voltage-type RF signals RF+ and RF- which are input to the gates of the transistors M1 and M2.

The frequency conversion stage 52 includes a plurality of switching transistors M3 to M6 and resistors $R_L$. The frequency conversion stage 52 receives LO signals LO+ and LO-, causes the output RF signals RF+ and RF- to transit by the frequencies of the LO signals LO+ and LO- so as to output IF signals IF+ and IF-, and detects output voltages of the IF signals IF+ and IF-.

The common mode feedback circuit 53 compares an output voltage VCM provided from the frequency conversion stage 52 with a preset reference voltage Vref so as to adjust the output voltage VCM such that the output voltage VCM is equalized to the reference voltage Vref. Then, the common mode feedback circuit 53 directly feeds the adjusted output voltage VCM back to the load stage 54.

The load stage 54 is implemented by PMOS transistors P1 to P4 and supplies a current I to the frequency conversion stage 52 through the PMOS transistors P1 to P4.

Since the load stage 54 is implemented by the PMOS transistors P1 to P4 as active elements, a bias voltage should be constantly adjusted so that the active elements operate in an operation region. The bias voltage is adjusted by the voltage VCMfeedback which is directly fed back from the common mode feedback circuit 53.

However, as the load stage of the conventional frequency conversion circuit is implemented by the PMOS transistors as active elements, a low-noise characteristic is significantly degraded, because of flicker noise which rapidly increases in the active elements.

SUMMARY OF THE INVENTION

An advantage of the present invention is that it provides a frequency conversion circuit in which a load stage is implemented using resistors, which are not active elements but passive elements, such that flicker noise can be significantly reduced to enhance a low-noise characteristic.

Another advantage of the invention is that it provides a frequency conversion circuit which can obtain a constant output voltage regardless of a change in temperature or process.

A further advantage of the invention is that it provides a frequency conversion circuit which uses a bleeding transistor so as to enhance a linearity and conversion gain, and can operate at a low voltage.

Additional aspect and advantages of the present general inventive concept will be set forth in part in the description which follows and, in part, will be obvious from the description, or may be learned by practice of the general inventive concept.

According to an aspect of the invention, a frequency conversion circuit comprises an input stage composed of one or more transistors, the input stage outputting a current corresponding to a voltage-type RF signal which is input to the gate of the transistor; a frequency conversion stage receiving an LO signal, causing the output RF signal to transit by the frequency of the LO signal so as to output an IF signal, and detecting an output voltage of the IF signal; a bleeding transistor connected to the input stage, supplying a current corresponding to a DC voltage, applied to a gate-source stage thereof, as a bleeding current to the transistor of the input stage, and in an AC manner, operating complementarily with the input stage to control a current flowing in the frequency conversion stage; a common mode feedback circuit comparing an output voltage provided from the frequency conversion stage with a preset reference voltage, adjusting the output voltage such that the output voltage is equalized to the reference voltage, and directly feeding the adjusted output voltage to the bleeding transistor; and a load stage composed of resistors and distributing a power supply voltage to apply to the frequency conversion stage.

The frequency conversion stage includes a plurality of transistors causing the RF signal output in the form of current to transit by the frequency of the LO signal and then outputting an IF signal; and a resistor detecting an output voltage of the IF signal through the IF signal output in the form of current and then providing the detected output voltage to the common mode feedback circuit.

In the input stage, the gate of the transistor receives an RF signal, the source thereof is grounded, and the drain thereof is connected to the sources of the transistors of the frequency conversion stage.

The gate of the bleeding transistor receives an RF signal and a DC voltage fed back from the common mode feedback circuit, the source thereof receives a power supply voltage, and the drain thereof is connected to the drain of the transistor of the input stage and the sources of the transistors of the frequency conversion stage.

The bleeding transistor receives, through the gate thereof, the RF signal applied to the transistor of the input stage so as to supply a drain current corresponding to a voltage change of the RF signal, and simultaneously, supplies a bleeding current to the transistor of the input stage, the bleeding current corresponding to a voltage applied to the gate and source thereof.

The bleeding transistor includes a bypass capacitor which applies only an AC RF signal.

The common mode feedback circuit includes a first transistor receiving the provided output voltage; a second transistor receiving the reference voltage; a pair of current mirroring sections equalizing currents flowing in the first and second transistors such that the provided output voltage is adjusted to be equal to the reference voltage, and feeding the adjusted output voltage back to the bleeding transistor; and a third transistor biasing the first and second transistors.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1A is a circuit diagram of a single-balanced frequency conversion circuit;

FIG. 1B is a circuit diagram of a double-balanced frequency conversion circuit;

FIG. 2 is a diagram showing the structure of a receiver using a direct conversion receiver (DCR) scheme;

FIG. 3 is a diagram showing a portion related to a frequency conversion circuit in the structure of FIG. 2;

FIG. 4A is a diagram showing a conceptual structure of a general common mode feedback circuit;

FIG. 4B is a circuit diagram of the common mode feedback circuit;

FIG. 4C is a diagram showing an output waveform of the common mode feedback circuit;

FIG. 5 is a circuit diagram of a conventional frequency conversion circuit; and

FIG. 6 is a circuit diagram of a frequency conversion circuit according to an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a preferred embodiment of the present invention will be described in detail with reference to the accompanying drawings.

FIG. 6 is a circuit diagram of a frequency conversion circuit according to an embodiment of the invention. As shown in FIG. 6, the frequency conversion circuit includes an input stage 61, a frequency conversion stage 62, a bleeding transistor 63, a common mode feedback circuit 64, and a load stage 65.

As shown in FIG. 6, the frequency conversion circuit uses a plurality of transistors. Each of the transistors includes a gate, a source, and a drain. The magnitude and direction of a current flowing from the drain to the source or from the source to the drain are determined by the magnitude and polarity of a voltage applied between the gate and the source.

As for the transistors, there are provided a bipolar junction transistor (BJT), a junction gate field-effect transistor (JFET), a metal-oxide-semiconductor transistor (MOS transistor), a metal-semiconductor field-effect transistor (MESFET) and the like.

The following descriptions will be focused on the MOS transistor. However, the invention can be applied to all the transistors having the above-described characteristic as well as the MOS transistor. Therefore, although the descriptions of the invention are focused on the MOS transistor, the scope of the invention is not limited to the MOS transistor.

Further, the following descriptions will be focused on a double-balanced frequency conversion circuit. Since a single-balanced frequency conversion circuit is easily appreciated by those skilled in the art, the specific descriptions of the single-balanced frequency conversion circuit will be omitted in this specification.

The input stage 61 includes two input transistors M1 and M2 forming one differential pair and outputs currents corresponding to voltage-type RF signals RF+ and RF− which are input to the gates of the transistors M1 and M2.

At this time, the gate of the transistor M1 receives an RF signal RF+, and the gate of the transistor M2 receives an RF signal RF−.

Further, the sources of the transistors M1 and M2 are grounded, and the drain of the transistor M1 is connected to the sources of transistors M3 and M4 of the frequency conversion stage, the transistors M3 and M4 forming a pair.

The frequency conversion stage 62 receives LO signals LO+ and LO− through the transistors M3 to M6 and causes the output RF signals RF+ and RF− to transit by the frequencies of the LO signals LO+ and LO− so as to output IF signals IF+ and IF−. The frequency conversion stage 62 detects output voltages VCM of the IF signals IF+ and IF− through resistors $R_L$ and then provides the detected output voltages VCM to the common mode feedback circuit 64.

As for the resistor $R_L$ for detecting the output voltage, a high-value resistor (for example, 10K ohm) is used so as not to have an effect upon output voltage swing.

In the frequency conversion stage 62, the transistors M3 and M4 form a pair, and the transistors M5 and M6 form a pair, as shown in FIG. 6. The gates of the transistors M3 and M6 receive an LO signal LO+, and the gates of the transistors M4 and M5 receive an LO signal LO−.

The sources of the transistors M3 and M4 are connected to the drain of the transistor M1 of the input stage, and the sources of the transistors M5 and M6 are connected to the drain of the transistor M2 of the input stage. The drains of the transistors M3 and M6 are connected to a power supply VDD through the load stage 65, and the drains of the transistors M4 and M5 are connected to the drains of the transistors M6 and M3 forming another pair.

The bleeding transistor 63 composed of the first and second bleeding transistors P1 and P2 is connected to the input stage 61 so as to supply a current as a bleeding current to the transistor of the input stage 61, the current corresponding to a DC voltage applied to a gate-source stage of the bleeding transistor 63. Simultaneously, the bleeding transistor 63 operates complementarily with the input stage 61 to control a current flowing in the frequency conversion stage 62.

At this time, the gate of the first bleeding transistor P1 receives an RF signal RF+ and a DC voltage VCMfeedback fed back by the common mode feedback circuit 64, the source thereof receives a power supply voltage VDD, and the drain thereof is connected to the drain of the transistor M1 and the sources of the transistors M3 and M4.

The gate of the second bleeding transistor P2 receives an RF signal RF− and a DC voltage VCMfeedback fed back by the common mode feedback circuit 64, the source thereof receives a power supply voltage VDD, and the drain thereof is connected to the drain of the transistor M2 and the sources of the transistors M5 and M6.

The gates of the first and second bleeding transistors P1 and P2 configured in such a manner receive the RF signals RF+ and RF− applied to the transistors M1 and M2 of the input stage so as to supply drain currents corresponding to voltage changes of the RF signals RF+ and RF−. Simultaneously, the first and second bleeding transistors P1 and P2 supply bleeding currents to the transistors M1 and M2 of the input stage, the bleeding currents corresponding to voltages applied to the gate and source thereof.

Therefore, a large amount of current can be supplied to the transistors M1 and M2 of the input stage through the first and second bleeding transistors P1 and P2 such that the linearity of the conversion frequency circuit can be enhanced. This is because the linearity of the frequency conversion circuit is mainly determined the linearity of the transistor of the input stage and, as a large amount of current flows, the linearity of the transistor of the input stage is enhanced.

As a large amount of current can be supplied to the transistors M1 and M2 of the input stage through the first and second bleeding transistors P1 and P2, it is possible to reduce an amount of current flowing in the transistors M3 to M6 of the frequency conversion stage. Accordingly, since a larger resistor 65 can be used in the transistors M3 to M6, a larger conversion gain can be obtained.

Further, as a large amount of current can be supplied to the transistors M1 and M2 of the input stage through the first and second bleeding transistors P1 and P2, the transistors M3 to M6 can be operated by a smaller gate-source voltage. Accordingly, the transistors M3 and M6 can perform a switching operation more smoothly with respect to the magnitudes of the LO signals LO+ and LO− applied thereby.

The bleeding transistor 63 may include a bypass capacitor C which applies only AC RF signals RF+ and RF−. Therefore, the bleeding transistor 63 can block DC RF signals RF+ and RF− and thus can eliminate a DC offset.

Meanwhile, the common mode feedback circuit 64 compares an output voltage VCM with a preset reference voltage Vref, the output voltage VCM being provided from the frequency conversion stage 62. Then, the common mode feedback circuit 64 adjusts the output voltage VCM such that the output voltage VCM is equalized to the reference voltage Vref, and directly feeds the adjusted output voltage VCM to the bleeding transistor 63.

Therefore, the adjusted output voltage VCMfeedback is directly fed back to the bleeding transistor 63 such that the characteristic of the conventional common mode feedback circuit can be used as it is. Accordingly, it is possible to secure a constant output voltage VCM regardless of a change in temperature or process.

The common mode feedback circuit 64 includes a first transistor M7 receiving the provided output voltage VCM, a second transistor M8 receiving the reference voltage Vref, current mirroring sections P3 and P4, which equalize currents flowing in the first and second transistors M7 and M8 such that the provided output voltage VCM is adjusted to be equal to the reference voltage Vref and feed the adjusted output voltage VCM back to the bleeding transistor 63, and a third transistor M9 biasing the first and second transistor M7 and M8.

The load stage 65 composed of resistors distributes a power supply voltage VDD to apply to the frequency conversion stage 62.

As such, as the load stage 65 is implemented using resistors which are not active elements but passive elements, it is possible to reduce flicker noise which rapidly increases in active elements. Accordingly, it is possible to secure a low-noise characteristic.

According to the invention, the frequency conversion circuit uses the bleeding transistor to enhance the linearity and conversion gain and can be operated at a low voltage.

Further, as the load stage is implemented using resistors which are not active elements but passive elements, it is possible to significantly reduce flicker noise such that a low-noise characteristic can be enhanced.

In addition, since the characteristic of the common mode feedback circuit can be used, it is possible to obtain a constant output voltage regardless of a change in temperature or process.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A frequency conversion circuit comprising:
   an input stage composed of one or more transistors, the input stage outputting a current corresponding to a voltage-type RF signal which is input to the gate of the transistor;
   a frequency conversion stage receiving an LO signal, causing the output RF signal to transit by the frequency of the LO signal so as to output an IF signal, and detecting an output voltage of the IF signal;
   a bleeding transistor connected to the input stage, supplying a current corresponding to a DC voltage, applied to a gate-source stage thereof, as a bleeding current to the transistor of the input stage, and in an AC manner, operating complementarily with the input stage to control a current flowing in the frequency conversion stage;
   a common mode feedback circuit comparing an output voltage provided from the frequency conversion stage with a preset reference voltage, adjusting the output voltage such that the output voltage is equalized to the reference voltage, and directly feeding the adjusted output voltage to the bleeding transistor; and
   a load stage composed of resistors and distributing a power supply voltage to apply to the frequency conversion stage.

2. The frequency conversion circuit according to claim 1, wherein the frequency conversion stage includes:
   a plurality of transistors causing the RF signal output in the form of current to transit by the frequency of the LO signal and then outputting an IF signal; and
   a resistor detecting an output voltage of the IF signal through the IF signal output in the form of current and then providing the detected output voltage to the common mode feedback circuit.

3. The frequency conversion circuit according to claim 2, wherein in the input stage, the gate of the transistor receives an RF signal, the source thereof is grounded, and the drain thereof is connected to the sources of the transistors of the frequency conversion stage.

4. The frequency conversion circuit according to claim 3, wherein the gate of the bleeding transistor receives an RF signal and a DC voltage fed back from the common mode feedback circuit, the source thereof receives a power supply voltage, and the drain thereof is connected to the drain of the transistor of the input stage and the sources of the transistors of the frequency conversion stage.

5. The frequency conversion circuit according to claim 4, wherein the bleeding transistor receives, through the gate thereof, the RF signal applied to the transistor of the input stage so as to supply a drain current corresponding to a voltage change of the RF signal, and simultaneously, supplies a bleeding current to the transistor of the input stage, the bleeding current corresponding to a voltage applied to the gate and source thereof.

6. The frequency conversion circuit according to claim 5, wherein the bleeding transistor includes a bypass capacitor which applies only an AC RF signal.

7. The frequency conversion circuit according to claim 1, wherein the common mode feedback circuit includes:

a first transistor receiving the provided output voltage;

a second transistor receiving the reference voltage;

a pair of current mirroring sections equalizing currents flowing in the first and second transistors such that the provided output voltage is adjusted to be equal to the reference voltage, and feeding the adjusted output voltage back to the bleeding transistor; and a third transistor biasing the first and second transistors.

* * * * *